United States Patent [19]

Mrozowski et al.

[11] Patent Number: 4,490,713

[45] Date of Patent: Dec. 25, 1984

[54] MICROPROCESSOR SUPERVISED ANALOG-TO-DIGITAL CONVERTER

[75] Inventors: Andrij Mrozowski; Paul R. Prazak, both of Tucson, Ariz.

[73] Assignee: Burr-Brown Inc., Tucson, Ariz.

[21] Appl. No.: 386,428

[22] Filed: Jun. 8, 1982

Related U.S. Application Data

[63] Continuation of Ser. No. 165,862, Jul. 7, 1980, abandoned, which is a continuation of Ser. No. 961,626, Nov. 11, 1978, abandoned.

[51] Int. Cl.³ ............................................. H03K 13/02
[52] U.S. Cl. ....................... 340/347 AD; 340/347 CC; 340/347 M; 324/99 D
[58] Field of Search ................... 340/347 M, 347 AD; 364/571, 573

[56] References Cited

U.S. PATENT DOCUMENTS

| | | | |
|---|---|---|---|
| 3,530,458 | 9/1970 | Willard et al. | 340/347 M X |
| 3,685,048 | 8/1972 | Pincus | 340/347 M X |
| 3,790,910 | 2/1974 | McCormack | 364/573 X |
| 3,858,236 | 5/1976 | Kelly | 340/347 CC X |
| 3,868,679 | 2/1975 | Arneson | 340/347 M X |
| 4,083,043 | 4/1978 | Breuer | 340/347 AD |
| 4,143,361 | 3/1979 | Tammes et al. | 340/347 CC |

OTHER PUBLICATIONS

Koeman et al., Error Correction Speeds Up A-D Conversion Tenfold, Electronics, Sep. 2, 1976, pp. 89-93.
Santoni, Multimeter Uses 8080 'Brain', Electronics, Aug. 19, 1976, pp. 117, 118.
Schmid, Electronic Analog/Digital Conversions, Van Nostrand Reinhold Co., 1970, pp. 317-319.
Hoeschele, Analog-to-Digital/Digital-to-Analog Conversion Techniques, John Wiley & Sons, Inc., 1970, pp. 363-365.

Primary Examiner—T. J. Sloyan
Attorney, Agent, or Firm—Weiss & Holloway

[57] ABSTRACT

An analog-to-digital converter which is supervised by a microprocessor and includes means for digitally compensating for initial gain and offset errors and gain and offset drift errors due to temperature variations. An analog input voltage is applied to a first analog-to-digital converter, the output of which is both stored in the microprocessor and applied to a linear digital-to-analog converter. The output of the linear converter is summed with the original analog input voltage and the difference applied to the conversion apparatus as an unknown input signal. This process is continued to achieve a desired resolution. The output of a differential temperature sensor is similarly processed to determine the proper amount of compensation for gain and offset drift. The microprocessor provides both control and computation capabilities.

1 Claim, 3 Drawing Figures

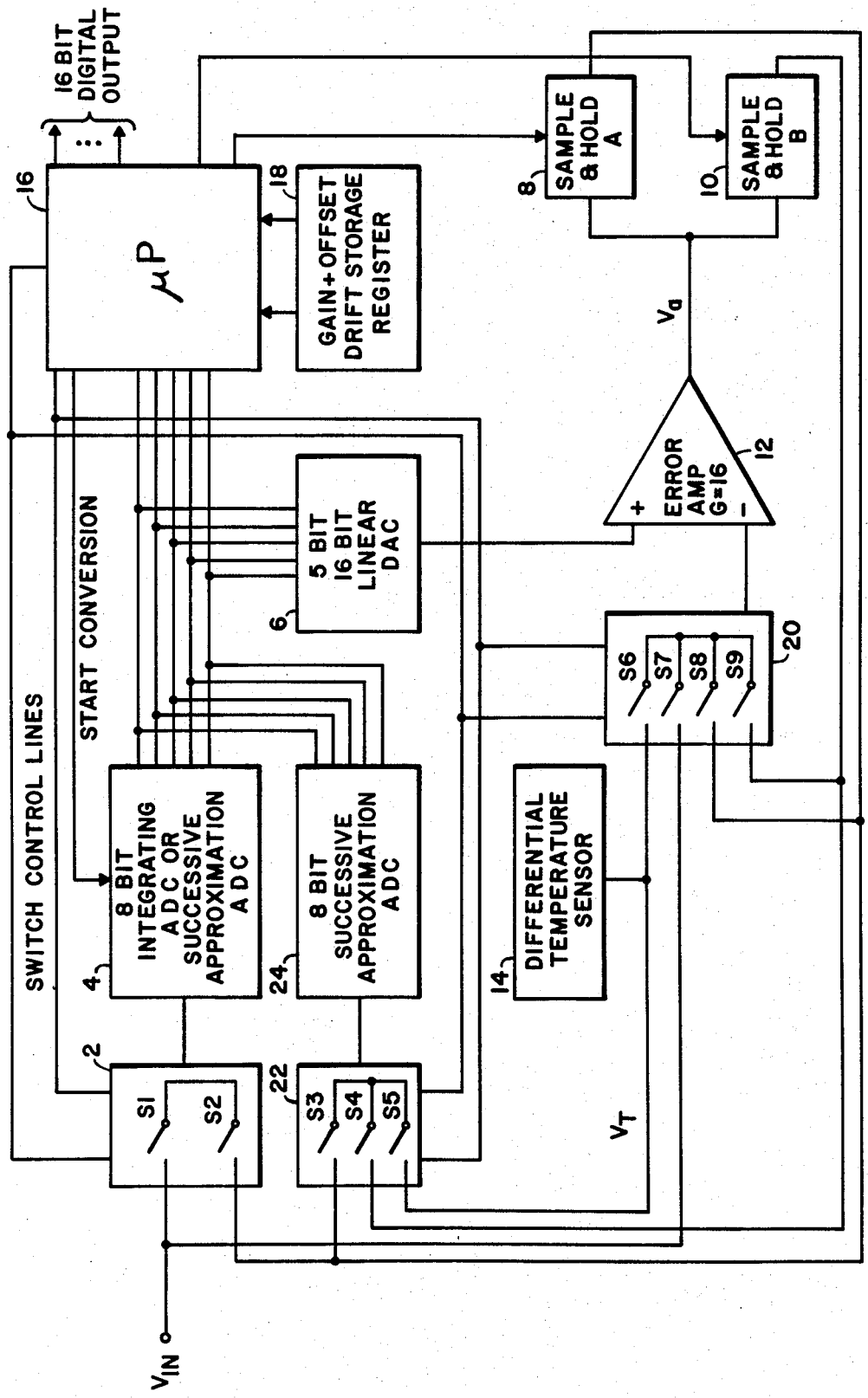
F.I.G. 3

MICROPROCESSOR SUPERVISED ANALOG-TO-DIGITAL CONVERTER

This application is a continuation of application Ser. No. 165,862, filed 7/7/80; which is a continuation of application Ser. No. 961,626, filed 11/11/78 (now abandoned).

BACKGROUND OF THE INVENTION

1. Field of the Invention

This invention relates generally to analog-to-digital converters, and, more particularly to a microprocessor supervised analog-to-digital converter with temperature compensation.

2. Description of the Prior Art

The use of a recirculating remainder technique to perform analog-to-digital conversion is well known. However, it has been necessary to provide special calculators or, in the alternative, a large amount of complex logic circuitry to perform the required computations associated with the recirculating remainder technique.

An additional disadvantage of known analog-to-digital converters employing the recirculating remainder technique resides in the use of analog devices to compensate for gain and offset drift which occurs as a result of temperature variations.

SUMMARY OF THE INVENTION

It is an object of the present invention to provide an analog-to-digital converter which is highly accurate over a wide temperature range.

It is a further object of the invention to provide a high-speed analog-to-digital converter which is supervised by a microprocessor which also provides computing power.

It is yet a further object of the present invention to provide an analog-to-digital converter which employs digital means for cancelling the effects of drift due to temperature variations.

A still further object of the present invention is to provide a high-speed analog-to-digital converter employing a low accuracy integrating analog-to-digital converter in conjunction with a successive approximation analog-to-digital converter.

According to a broad aspect of the invention there is provided a microprocessor supervised analog-to-digital converter implemented to perform a recirculating remainder conversion of an analog input signal, comprising first means for performing a first conversion of said analog input signal into a digital representation; second means coupled to said first means for comparing said digital representation with said analog input signal to produce a remainder signal corresponding to the difference; third means for substituting said remainder signal for said analog input signal to produce a second conversion resulting in the production of a second digital representation and a second remainder signal; and microprocessing means coupled to said first means and said third means for controlling the number of conversions each of which produces a remainder signal and a consequent digital representation thereof, for storing said digital representations and computing therefrom a digital output corresponding to said analog input voltage.

According to a further aspect of the invention there is provided a method of converting an analog input voltage into a digital output, comprising applying said analog input voltage to a first analog-to-digital converter to obtain a digital representation thereof; converting said digital representation into an analog voltage; comparing said analog voltage with said analog input signal; generating a remainder signal corresponding to the difference between said analog voltage and said analog input signal; substituting said remainder signal for said analog input signal to generate a digital representation thereof and a second remainder signal, each time substituting the new previous remainder signal, storing the digital representations of the analog input voltage and a predetermined number of subsequent remainder signals in a microprocessor, determining in said microprocessor the amount of drift compensation required as a result of temperature variations; and generating in said microprocessor a digital output corresponding, after drift compensation, to said analog input voltage.

The above and other objects, features and aspects of the invention will be more clearly understood from the following detailed description taken in conjunction with the accompanying drawings, in which:

BRIEF DESCRIPTION OF THE DRAWINGS

FIG. 3 is a block diagram of a third embodiment of an analog-to-digital converter according to the present invention.

DESCRIPTION OF THE PREFERRED EMBODIMENTS

Figure 1:
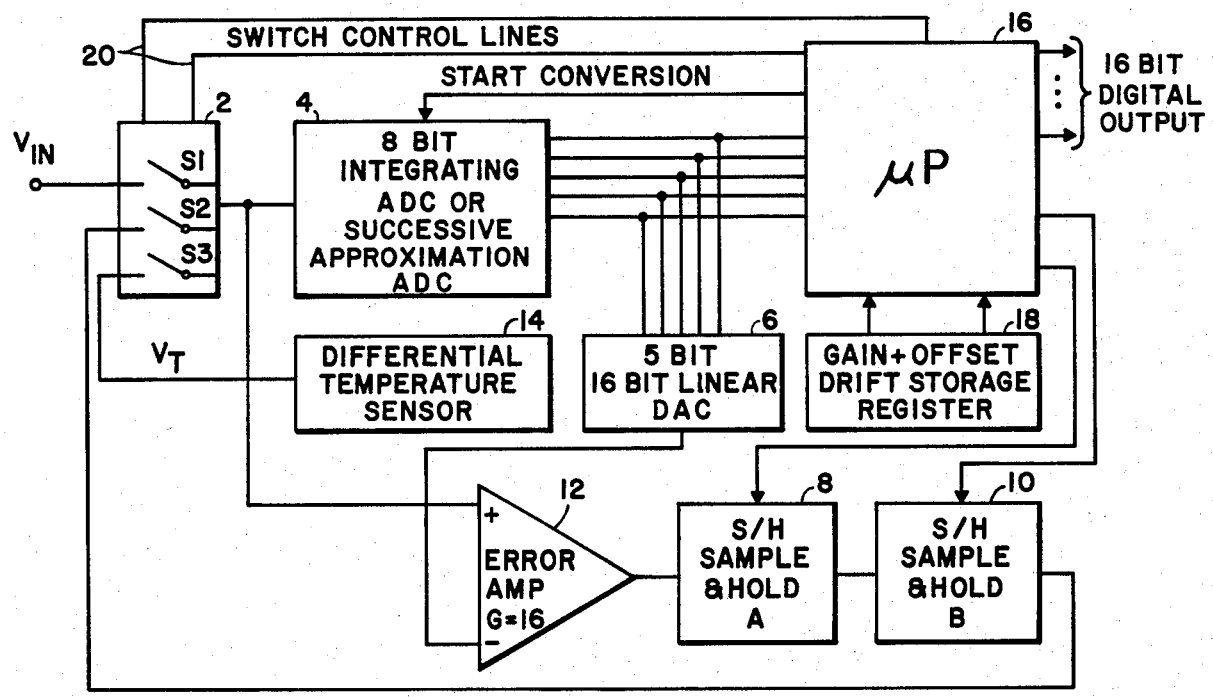
FIG. 1 is a block diagram of a first embodiment of an analog-to-digital converter according to the present invention.

FIG. 1 is a block diagram of a preferred embodiment of the inventive analog-to-digital converter. It consists of a bank of switches 2 (S1, S2 and S3), an eight-bit integrating analog-to-digital converter 4 (or a successive approximation analog-to-digital converter), a five-bit resolution sixteen-bit linear digital-to-analog converter 6, sample-and-hold circuit 8, sample-and-hold circuit 10, a summing amplifier 12, a differential temperature sensor 14, a microprocessor 16 and gain and offset drift storage register 18.

Sample-and-hold circuits 8 and 10 are used to store intermediate voltages, and microprocessor 16 controls the conversion sequence, signal flow through electronic switches 2 and performs all computations necessary to obtain a 16-bit digital word representing the analog input.

Speed of conversion is limited by integrating analog-to-digital converter 4 and the requirements for high normal mode rejection. To increase the speed of conversion, the integrating analog-to-digital converter may be replaced by a successive approximation analog-to-digital converter.

Conversion of an input voltage Vin is commenced when electronic switch S1 is closed by microprocessor 16 by means of switch control lines and when 8-bit integrating analog-to-digital converter 4 receives a "Start Conversion" signal from microprocessor 16. Microprocessor 16 may be any one of a variety of known types such as a MOSTEK 3870. Switches S1, S2 and S3 may comprise a commercially available quad-switch of the type used by Burr-Brown Research Corporation and bearing part number ICC-701. The eight-bit integrating analog-to-digital converter may be of a commercially available type, for example, a Teledyne 8703.

A five-bit output from integrating analog-to-digital converter 4 represents a first digital approximation of the analog input voltage Vin. This first approximation is applied to inputs of microprocessor 16 and to inputs of linear digital-to-analog converter 6 which may include a 12-bit current switch of the type bearing Burr-Brown part number CIC-294.

The output of digital-to-analog converter 6 is applied to an input of error amplifier 12 and is summed with the input voltage Vin. The difference is multiplied by sixteen since error amplifier 12 is designed to have a gain of sixteen. At this point, sample-and-hold 8 is in a "sample" mode and sample-and-hold 10 is in a "hold" mode as a result of control signals applied to sample-and-hold circuits 8 and 10 from microprocessor 16. Thus, the output of error amplifier 12 (Va) is received by the first sample-and-hold circuit 8.

Microprocessor 16 then places sample-and-hold circuit 8 in a "hold" mode and sample-and-hold circuit 10 in a "sample" mode. Thus, the error voltage Va is now stored in sample-and-hold 8 and is applied to sample-and-hold 10. Now, by again placing sample-and-hold 10 in a "hold" mode and sample-and-hold 8 in a "sample" mode, the error voltage Va is stored in sample-and-hold circuit 10. Thus, there has been a shifting of the error voltage Va from the output of error amplifier 12 through sample-and-hold circuit 8 to sample-and-hold circuit 10.

Further, there has been a first conversion of the input voltage Vin stored in microprocessor 16 in the form of a five-bit digital word.

The microprocessor 16 now causes switch S1 to open and switch S2 to close. The voltage stored in sample-and-hold circuit 10 is applied via switch S2 to analog-to-digital converter 4 as a unknown input voltage and is also applied to one input of error amplifier 12. As a result, a second five-bit digital conversion is stored in microprocessor 16. Since the output of digital-to-analog converter 6 is still coupled to an input of error amplifier 12, a second error signal Va is generated. This error voltage is shifted serially through sample-and-hold circuit 8 to sample-and-hold circuit 10 as described above. Switch S2 remains closed until third and fourth five-bit conversions are generated by analog-to-digital converter 4 and stored in microprocessor 16.

While the conversion process may be repeated as many times as required to obtain a desired resolution, 16 conversions during one 30 Hz period result in good normal mode rejection. Further, four conversions are required to obtain sixteen-bit resolution, and since a sixteen-bit accurate linear digital-to-analog converter is utilized, maximum obtainable linearity is 0.001%. Of course, a better digital-to-analog converter (e.g. 18-bit, 20-bit, etc.) may be employed to achieve greater linearity. For example, an 18-bit digital-to-analog converter increases accuracy to 0.00019%. Furthermore, the use of an external reference would permit the microprocessor to calculate linearity errors for each bit and digitally compensate for them.

After four conversions have been completed, microprocessor 16 processes the four 5-bit words to obtain a sixteen-bit digital word representing the analog input.

The inventive conversion system compensates for gain and offset drift which results from temperature variations as follows. Prior to beginning the conversion process for an input voltage Vin (e.g. during initialization or reset of the system), a first reference voltage (+Vri), for example +9.92187 volts, is applied to the conversion apparatus to determine a positive full-scale reference. A second reference voltage (−Vri), for example −9.92218 volts is applied to the conversion apparatus to determine a negative full-scale reference. Both the positive and negative full-scale voltages are stored in microprocessor 16 in the form of sixteen-bit digital words. Next, switch S3 is closed (S1 and S2 are open), and a voltage generated by differential temperature sensor 14 is applied to the conversion apparatus via switch S3. After four conversions of this voltage, in a manner described above, a sixteen-bit temperature reference is likewise stored in microprocessor 16. This calibration phase should be performed in the same environment as that in which the conversion apparatus will be employed, to obtain maximum compensation range over ±25° C. around ambient temperature.

After the calibration phase is complete, the analog-to-digital conversion of an analog input voltage Vin proceeds in the manner described above. After a sixteen-bit digital representation of the input voltage Vin has been computed and stored in microprocessor 16, switch S2 is opened and switch S3 is closed by microprocessor 16 via switch control lines 20. This permits a voltage Vt generated by differential temperature sensor 14, which may include a thermistor, to be applied to the remainder of the conversion apparatus via switch S3. After four conversions of the type above described, a sixteen-bit digital representation of Vt is computed and stored in microprocessor 16. This digital representation of Vt is then compared with the sixteen-bit temperature reference voltage which was stored in microprocessor 16 during the calibration phase. The differential temperature sensor is chosen such that a temperature change of 1° C. will correspond to a voltage difference of thirty-two least significant bits which merely corresponds to a shift right by five bits. This may be accomplished by employing a thermistor of the type bearing Burr-Brown part number RTC103-502.

Gain and offset drift storage register 18 is pre-programmed to contain the amount of gain and offset drift which occurs as a function of temperature change. Thus, after the temperature change has been calculated by dividing the temperature voltage difference by thirty-two, the gain and offset drift storage register is searched to determine the appropriate amount of gain and offset drift compensation. The sixteen-bit digital representation of the analog input voltage is then compensated by this amount, and the result is available at the output of microprocessor 16.

Figure 2:
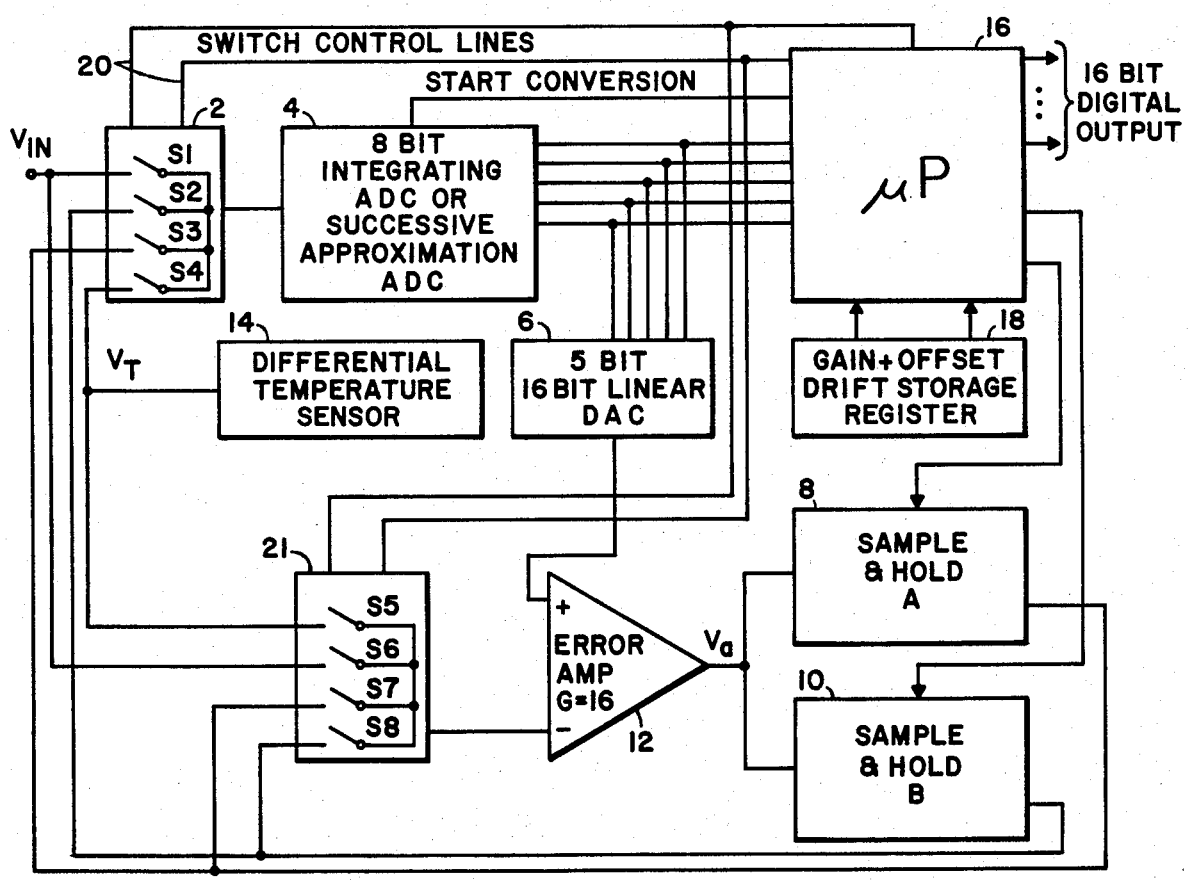
FIG. 2 is a block diagram of a second embodiment of the inventive analog-to-digital converter.

FIG. 2 is a block diagram of a second embodiment of the inventive microprocessor supervised analog-to-digital converter. Like elements are denoted by like reference numbers; however, in this embodiment switch bank 2 contains switches S1, S2, S3 and S4. An additional bank of switches 20 contains switches S5, S6, S7 and S8.

Conversion of the input voltage Vin is commenced when switches S1 and S6 are closed by microprocessor 16 via the switch control lines and when converter 4 receives a "Start Conversion" signal from microporcessor 16. A first five-bit output from converter 4 represents a first approximation of the analog input voltage Vin. This first approximation is stored in microprocessor 16 and is applied to inputs of coverter 6.

The output of digital-to-analog converter 6 is applied to error amplifier 12. The input voltage Vin is likewise applied to error amplifier 12 and the resulting error voltage (Va) is applied to sample-and-hold circuit 8 which was previously placed in a "sample" mode by microprocessor 16. When Va is stored in sample-and-hold 8, microprocessor 16 opens switches S1 and S6 and closes switches S3 and S7. In this manner, the voltage (Va) stored in sample-and-hold circuit 8 is applied as an unknown input voltage to converter 4 via switch S3 and to error amplifier 12 via switch S7. A second conversion is stored in microprocessor 16 and a second error voltage is applied to sample-and-hold circuit 10 which has been placed in a "sample" mode by microprocessor 16.

Switches S3 and S7 are now opened and switches S2 and S8 are closed by microprocessor 16. In this manner, the contents of sample-and-hold circuit 10 is applied as an unknown input voltage to converter 4 via switch S2 and to error amplifier 12 via switch S8. The resulting error voltage (Va) is stored in sample-and-hold circuit 8 thus completing a third conversion. Switches S2 and S8 are opened and switches S3 and S7 are closed to accomplish a fourth conversion.

Microprocessor 16 then processes four 5-bit words representing the four conversions to obtain a sixteen-bit digital word representing the analog input Vin.

Gain and offset drift are compensated for in the same manner described in conjunction with the apparatus shown in FIG. 1 using the following switch sequence. The first conversion of the differential temperature sensor 14 output voltage (Vt) is accomplished by closing switches S4 and S5. For the second conversion, switches S3 and S7 are closed. Switches S2 and S8 are closed for the third conversion, and switches S3 and S7 are again closed for the fourth conversion. Of course, compensation for gain and offset drift requires a calibration phase similar to that described in conjunction with FIG. 1 using the appropriate switch sequence; i.e. S4 and S5; S3 and S7; S2 and S8; S3 and S7.

FIG. 3 is a block diagram of a third embodiment of the inventive microprocessor supervised analog-to-digital converter. Like elements are again denoted by like reference numbers; however, in this embodiment switch bank 2 contains switches S1 and S2, switch bank 20 contains switches S6, S7, S8 and S9 and a new bank of switches 22 contains switches S3, S4 and S5. Furthermore, an additional eight-bit successive approximation analog-to-digital converter is provided having an input coupled to sample-and-hold circuit 8, sample-and-hold circuit 10 and differential temperature sensor 14 via switches S3, S4 and S5 respectively. A five-bit output from converter 24 is coupled to microprocessor 16 and linear digital-to-analog converter 6 as is the output of analog-to-digital converter 4. The inclusion of successive approximation analog-to-digital converter 24 increases the speed of the inventive analog-to-digital converter while introducing only a small amount of error.

The system operates in a manner similar to that of the arrangement shown in FIG. 2. The primary difference resides in the switching sequence for switches S1-S9. For the first conversion of an input analog voltage (Vin), switches S1 and S7 are on. The second conversion takes place when switches S2 and S8 are on and the remaining switches are off. For the third conversion, all switches are off except switches S4 and S9. Finally, to accomplish the fourth conversion all switches are off except switches S3 and S8. The same switching sequence is employed when converting Vt from differential temperature sensor 14 during both the calibration phase and the compensation phase.

The sample-and-hold circuits and the gain and offset drift registers are commercially available integrated circuits, preferably of the types bearing Burr-Brown part numbers ICC 702 and ICC 317 respectively. Furthermore, error amplifier 12 may be implemented in any standard configuration, for example, of the type employing three operational amplifiers bearing Burr-Brown part number ICC 108. A first input of a first operational amplifier is coupled to the analog input voltage (Vin), and a first input of a second operational amplifier is coupled to the output of linear digital-to-analog converter 6. A second input of the first and second operational amplifiers are coupled together. The outputs of the first and second operational amplifiers are coupled respectively to first and second inputs of a third operational amplifier.

While the inventive analog-to-digital converter has been particularly shown and described with reference to preferred embodiments thereof, it should be understood by those skilled in the art that changes in form and details may be made therein without departing from the spirit and scope of the invention.

What is claimed is:

1. A microprocessor supervised analog-to-digital converter implemented to perform a recirculating remainder conversion of an analog input signal, comprising:

analog-to-digital conversion means for performing a first conversion of an analog signal into a digital representation;

a digital-to-analog converter having inputs connected to outputs of said conversion means for producing an analog voltage corresponding to said digital representation;

an error amplifier having a first input coupled to the output of said digital-to-analog converter and a second input coupled to said analog input signal to produce a remainder signal corresponding to the difference therebetween at the output of said error amplifier;

means for substituting said remainder signal for said analog signal to produce a second conversion by said conversion means resulting in the production of a second digital representation and a second remainder signal;

microprocessor means coupled to the outputs of said conversion means for receiving said digital representations simultaneously with the applicaton of said digital representations to said digital-to-analog converter for storing said digital representations and for computing therefrom a digital output corresponding to said analog input signal, said microprocessor means coupled to said substituting means and having means for controlling the number of conversions each of which produces a remainder signal and consequent digital representations thereof, said substituting means comprising:

first and second sample-and-hold circuits controlled by said microprocessor means and having inputs coupled to an output of said error amplifier for alternately receiving and storing successive remainder signals;

first switching means controlled by said microprocessor means for selectively coupling said analog input signal, said first sample-and-hold circuit and said second sample-and-hold circuit to said conversion means; and second switching means for selectively coupling said analog input signal, said first sample-and-hold circuit and said second sample-and-hold circuit to said error amplifier;

means for producing a voltage indicative of termperature;

means coupled to said means for producing a voltage indicative of temperature and said conversion means for substituting said voltage for said analog input signal, said microprocessor means generating a digital representation of said voltage to determine the amount of drift compensation to be applied to said digital output; and first storage means coupled to said microprocessor means for storing, in digital form, amounts of drift compensation for various amounts of temperature change, said storage means containing the amount of gain and offset drift which occurs as a function of temperature change.

* * * * *